United States Patent
Kitch

(10) Patent No.: US 6,313,000 B1
(45) Date of Patent: Nov. 6, 2001

(54) PROCESS FOR FORMATION OF VERTICALLY ISOLATED BIPOLAR TRANSISTOR DEVICE

(75) Inventor: Vassili Kitch, San Ramon, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/442,810

(22) Filed: Nov. 18, 1999

(51) Int. Cl.⁷ .................................. H01L 21/331

(52) U.S. Cl. .................. 438/309; 438/510; 438/318; 438/353; 438/357; 438/358; 438/363; 438/355; 438/359; 438/416; 438/418; 438/426

(58) Field of Search .................. 438/309, 318, 438/353, 357, 358, 363, 355, 416, 418, 426, 359, 510

(56) References Cited

U.S. PATENT DOCUMENTS

| | | | |
|---|---|---|---|
| 4,452,645 | 6/1984 | Chu et al. | 148/1.5 |
| 4,662,062 | 5/1987 | Toyooka et al. | 29/578 |
| 4,710,241 | 12/1987 | Komatsu | 437/162 |
| 4,713,355 | 12/1987 | Gardner | 437/31 |
| 4,745,087 | 5/1988 | Iranmanesh | 437/69 |
| 4,789,885 * | 12/1988 | Brighton et al. | 257/588 |
| 4,866,001 * | 9/1989 | Pickett et al. | 438/330 |
| 5,055,419 | 10/1991 | Scovell et al. | 437/31 |
| 5,444,004 | 8/1995 | Jang | 437/31 |
| 5,506,169 | 4/1996 | Guldi | 437/70 |
| 5,525,529 | 6/1996 | Guldim | 437/28 |
| 5,580,798 | 12/1996 | Grubisich | 437/34 |
| 5,643,809 | 7/1997 | Lien | 437/31 |
| 5,698,459 | 12/1997 | Grubisich | 437/31 |
| 5,825,066 | 10/1998 | Buynoski | 257/345 |
| 6,225,181 * | 5/2001 | Gregory | 438/355 |

OTHER PUBLICATIONS

Funaki, H. et al., "*High Voltage BiCDMOS Technology on Bonded 2μm SOI Integrating Vertical npn pnp, 60V–LDMOS and MPU, Capable of 200 °C Operation*", IEEE pp. 967–970 (1995).

Yoshida, M. et al., "*A Bipolar–Based o.5 μm BiCMOS Technology on Bonded SOI for High–Speed, LSIs*", IEICE TRANS. Electron, vol. E77–C, No. 8, pp. 1395–1403 (1994).

Haydn J. Gregory, *Trench Isolated Bipolar Transistor Structure Integrated with CMOS Technology*, Co–pending U.S. Application 09/294,124 filed Apr. 19, 1999.

\* cited by examiner

Primary Examiner—Matthew Smith
Assistant Examiner—B. V. Keshavan
(74) Attorney, Agent, or Firm—Stallman & Pollack LLP

(57) ABSTRACT

A vertically-isolated bipolar transistor occupying reduced surface area is fabricated by circumscribing an expected active device region within a first narrow trench. The first trench is filled with sacrificial material impermeable to diffusion of conductivity-altering dopant, and then isolation dopant of a conductivity type opposite to that of the substrate is introduced into the trench-circumscribed silicon region. The introduced isolation dopant is then thermally driven into the substrate, with lateral diffusion of isolation dopant physically constrained by the existing first narrow trench. Epitaxial silicon is then formed over the substrate, with polysilicon formed in regions overlying the filled narrow trench. A second, wider trench encompassing the first trench is etched to consume epitaxial silicon, polysilicon, and the sacrificial material. The second trench is then filled with dielectric material. Base and emitter structures are formed in the conventional manner within the trench-circumscribed silicon. Constraint of lateral diffusion of isolation-type dopant by the first trench reduces lateral dimensions of the isolation region and of the overall device. The smaller device area permits enhanced device packing density and reduces parasitic capacitance arising between the isolation region and the substrate.

15 Claims, 6 Drawing Sheets

PROCESS FOR FORMATION OF VERTICALLY ISOLATED BIPOLAR TRANSISTOR DEVICE

BACKGROUND OF THE INVENTION

1. Field of the Invention

The present invention relates to a process for forming a transistor device, and in particular, to a process for forming a vertically isolated bipolar transistor having a doped isolation region constrained by a trench.

2. Description of the Related Art

FIG. 1A shows a plan view of a conventional vertically-isolated PNP bipolar transistor 100 formed in P-type silicon substrate 102 and overlying P-type epitaxial silicon 164. FIG. 1B shows a cross-sectional view of the transistor of FIG. 1A along the line 1B–1B'.

PNP transistor 100 comprises N-type base region 104 formed in P-type collector region 106. P-type emitter region 108 is formed within base 104. Collector region 106 of bipolar transistor 100 is in electrical contact with heavily doped buried P-type layer 110. Electrical contact to buried P-type layer 110 is permitted through P-type sinker 112. Electrical contact with emitter 108 is permitted through polysilicon emitter contact structure 114. Polysilicon emitter contact structure 114 is separated from base region 104 by dielectric 116.

Lateral electrical isolation of PNP transistor 100 from adjacent devices is accomplished by trench isolation structure 118 comprising surface LOCOS isolation 120 overlying polysilicon-filled deep trench 122.

Because collector 106 of bipolar transistor 100 is P-type silicon, collector 106 must be electronically isolated from underlying P-type substrate 102 in which adjacent devices are formed. Therefore, vertical isolation of PNP bipolar transistor 100 is accomplished by underlying N-type isolation region 124. Electrical contact with isolation region 124 is enabled by N-type sinker 126.

FIGS. 2A–2G show cross-sectional views of a conventional process flow for forming the bipolar transistor of FIGS. 1A–1B. FIG. 2A shows the starting point of the process, wherein first photoresist mask 250 is patterned over P-type single crystal silicon substrate 202, and N-type dopant is implanted into unmasked region 252 to form implanted N-isolation region 254. In the example shown in FIGS. 2A–2G, implanted N-isolation region 254 is a square 10 μm×10 μm region having a depth of 0.2 μm.

FIG. 2B shows the next step in the process, wherein the first photoresist mask is stripped, and P-type silicon substrate 202 is heated to drive implanted N-type dopant into substrate 202. Thermal diffusion of dopant associated with the heating shown in FIG. 2B causes implanted N-isolation region 254 to spread both laterally and vertically to form a 30 μm×30 μm diffused N-isolation region 224 having a depth of 10 μm. As will be discussed at length, this thermal diffusion step undesirably increases the size of the bipolar device and thereby reduces packing density.

FIG. 2C shows the next step, wherein second photoresist mask 258 is patterned over P-type substrate 202, and P-type dopant is implanted into unmasked region 260 to form "buried" P-type layer 210. FIG. 2D shows that P-type layer 210 is "buried" by P-type epitaxial silicon 264 subsequently created over P-type substrate 202, forming P-type collector 206.

In FIG. 2E, additional photoresist masks (not shown) are successively patterned. P-type dopant 266 is implanted into single crystal silicon to form precursor P-type collector sinker 268, and N-type dopant 270 is implanted into single crystal silicon to form precursor N-isolation sinker 272.

FIG. 2F shows patterning of third photoresist mask 274, followed by etching of epitaxial silicon 264 and underlying silicon substrate 202 in unmasked regions 274 to form deep trenches 222. Deep trenches 222 extend to a depth into substrate 202 below buried P-type layer 210.

FIG. 2G shows a second thermal drive-in step, wherein the silicon is heated to drive the N- and P-type sinker dopant further into the single crystal silicon. As a result of the thermal diffusion of dopant, the precursor P-type collector sinker is transformed into P-type collector sinker 212 contacting buried P-type layer 210. Precursor N-isolation sinker is transformed into N-isolation sinker 226 contacting N-isolation region 224. FIG. 2G also shows the filling of deep trenches 222 with polysilicon, followed by formation of surface LOCOS structures 220 overlying polysilicon-filled deep trenches 222.

Completion of fabrication of the bipolar device of FIGS. 1A and 1B is accomplished by conventional processes.

While the conventional process flow for forming the PNP bipolar transistor is suitable for many applications, the process suffers from a serious disadvantage. Specifically, formation of the N-isolation region by ion-implantation followed by thermal drive-in (as depicted in FIGS. 2A–2B) produces an N-isolation region having lateral dimensions much greater than is necessary to accomplish vertical isolation.

For example, in FIG. 1A diffused N-isolation region 124 is a square having dimensions of 30 μm×30 μm, yielding a total device area of about 1000 μm$^2$. This N-isolation area is excessively large to afford vertical isolation, and the surface area occupied by the isolation region undesirably lowers permissible packing density of the bipolar devices.

Therefore, there is a need in the art for a process for forming a vertically-isolated bipolar transistor permitting greater device packing density than conventional processes.

SUMMARY OF THE INVENTION

The present invention proposes a process flow for forming a vertically-isolated bipolar transistor in which the area occupied by the isolation region is constrained by prior formation of a trench. Specifically, a first trench is etched in the substrate to circumscribe a silicon area expected to be occupied by active device regions. Dopant providing vertical isolation is then implanted and thermally driven into the silicon. The implanted isolation dopant diffuses vertically into the substrate, but lateral expansion is prevented by the trenches. In this manner, a bipolar transistor device having substantially reduced lateral dimensions is fabricated, thereby enabling increased device packing density.

An embodiment of a process flow for forming a bipolar transistor in accordance with the present invention comprises the steps of forming a first trench in a semiconductor workpiece of a first conductivity type, the first trench circumscribing a precursor device region, and filling the first trench with a sacrificial material. Conductivity-altering dopant of a second conductivity type opposite to the first conductivity type is introduced into the precursor device region and caused to diffuse in a vertical direction into the semiconductor workpiece, the first trench constraining lateral diffusion within the semiconductor workpiece of the conductivity-altering dopant of the second type. A second trench is formed in the semiconductor workpiece, the second trench broader than and encompassing the first trench, such that the sacrificial material is consumed. The second trench is filled with a dielectric material. A collector of the first conductivity type is formed within the precursor device region. A base of the second conductivity type is formed within the collector, and an emitter of the first conductivity type is formed within the base.

An embodiment of a method of constraining lateral diffusion of conductivity-altering dopant within a semiconductor workpiece during a thermal drive-in step comprises the steps of circumscribing a precursor doped region of the semiconductor workpiece with a first trench, introducing conductivity-altering dopant into the precursor doped region, and applying thermal energy to drive the dopant into the semiconductor workpiece after formation of the first trench, such that the first trench blocks lateral diffusion of the conductivity-altering dopant.

The features and advantages of the present invention will be understood upon consideration of the following detailed description of the invention and the accompanying drawings.

DETAILED DESCRIPTION

The process flow in accordance with the present invention constrains lateral diffusion of isolation dopant with trenches formed prior to thermal drive-in. In this manner, lateral dimensions of bipolar transistor devices are substantially reduced and device packing densities enhanced.

Figure 3A:
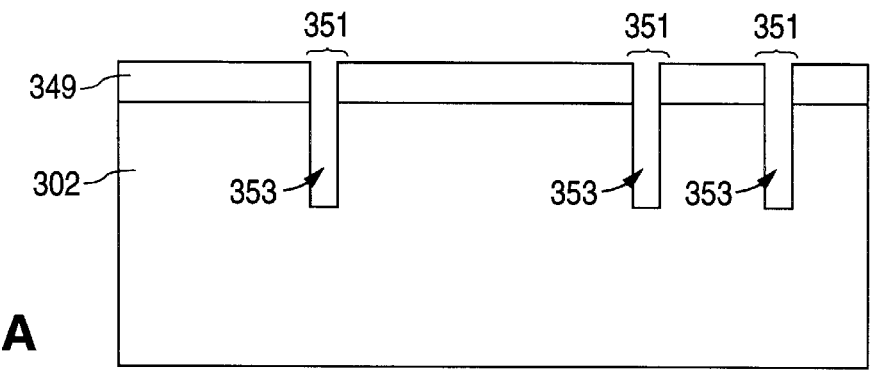
FIGS. 3A–3I show cross-sectional views of a process flow for forming a vertically-isolated PNP bipolar transistor in accordance with one embodiment of the present invention.

FIG. 3A shows the starting point for the process flow in accordance with one embodiment of the present invention. First photoresist mask 349 is patterned over single crystal silicon substrate 302. Unmasked regions 351 exposed by first photoresist mask 349 are then etched to create narrow deep trench 353, which appears in the cross-sectional view of FIG. 3A as a plurality of trenches.

Unmasked regions 351 and the corresponding trench 353 are relatively narrow because trench 353 is intended only to serve as a physical barrier to thermal diffusion of isolation dopant. After stripping of the first photoresist mask, narrow deep trench 353 is filled with a sacrificial material (such as silicon oxide) that is impermeable to diffusion by conductivity-altering dopant.

Figure 3B:
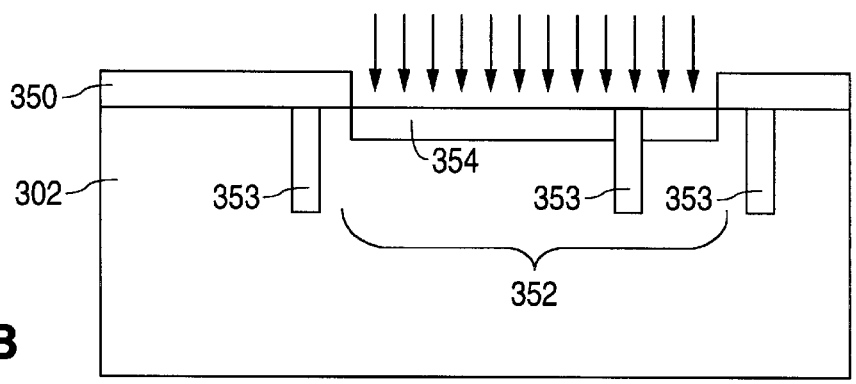

FIG. 3B shows patterning of second photoresist mask 350. N-type dopant is then implanted into unmasked region 352 of substrate 302, creating implanted isolation region 354.

Figure 3C:
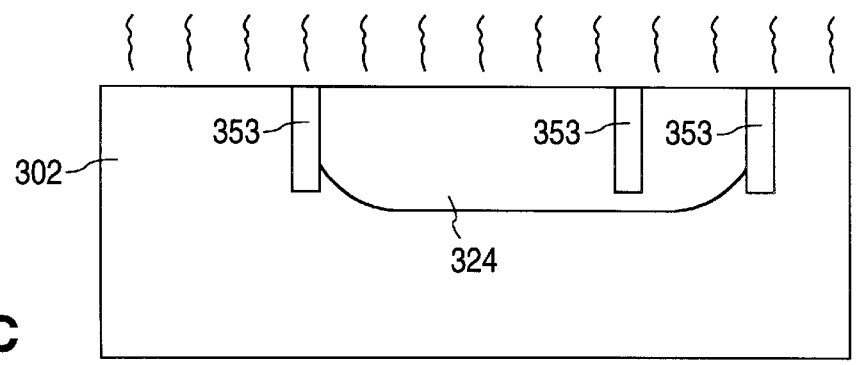

Next, FIG. 3C shows removal of the second photoresist mask, followed by exposure of the implanted substrate 302 to heating. This heating causes thermal diffusion and expansion of implanted isolation region 354 to create diffused N-type isolation region 324. It is during this step that lateral expansion of isolation dopant is restricted by the deep narrow trench that has already been formed.

Figure 3D:
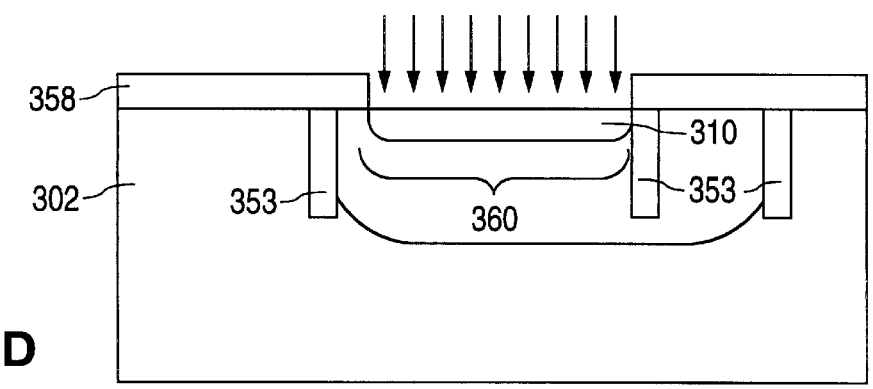

FIG. 3D shows patterning of third photoresist mask 358 over substrate 302, followed by ion-implantation of P-type dopant into unmasked region 360 to form buried P-type layer 310.

Figure 3E:
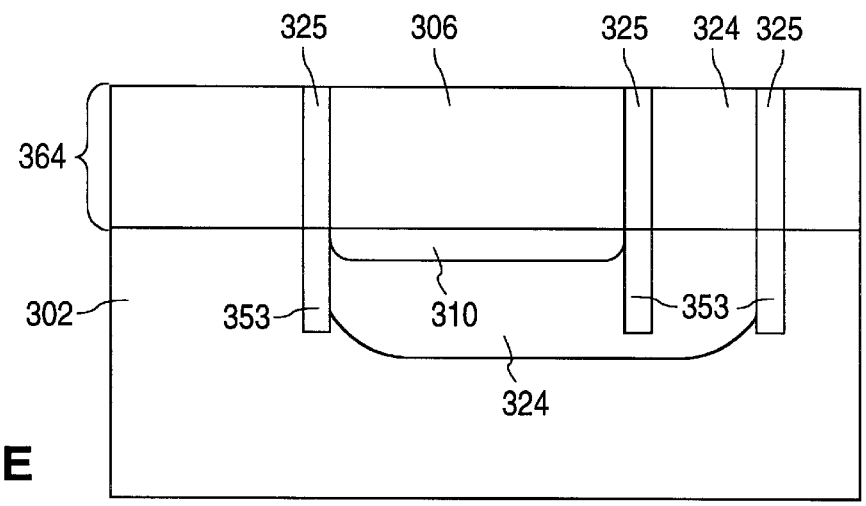

After removal of the third photoresist mask, FIG. 3E shows formation of P-type epitaxial silicon 364 over silicon substrate 302. As a result of epitaxial growth, P-type collector region 306 is created above buried P-type layer 310. Polysilicon 325, rather than single crystal silicon, is formed over first narrow trench 353 due to an absence of underlying single crystal silicon to serve as a template.

Figure 3F:
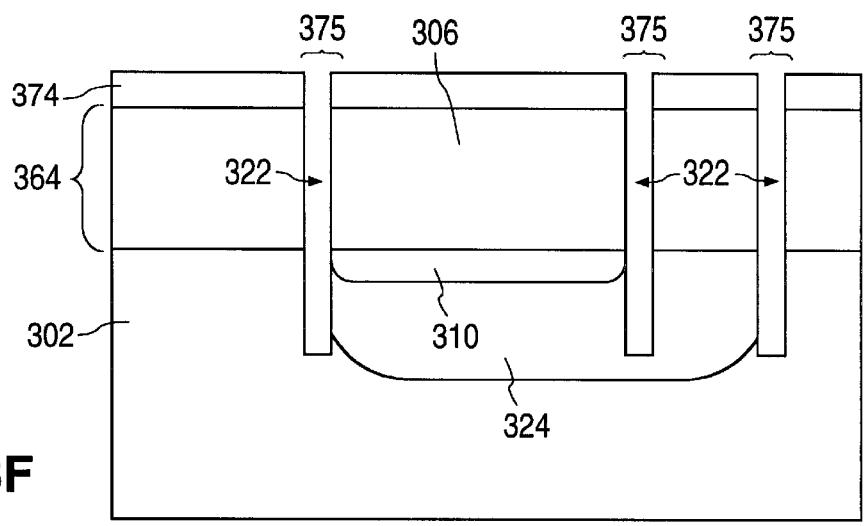

FIG. 3F shows patterning of fourth photoresist mask 374 over epitaxial silicon 364. Epitaxial silicon 364, silicon substrate 302, and polysilicon 325 underlying unmasked regions 375 are then etched to form second deep trench 322. Second deep trench 322 is wider than and encompasses the first narrow trench, such that epitaxial silicon, polysilicon, and the sacrificial material within the first narrow trench are consumed.

Figure 3G:
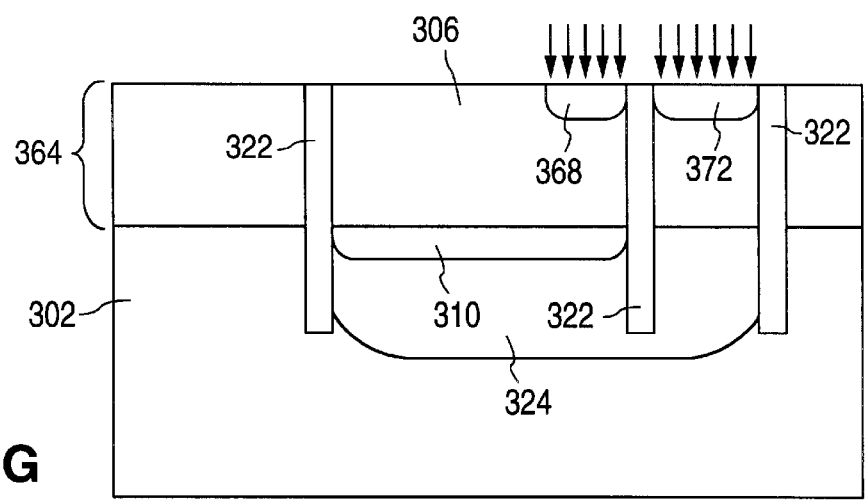

FIG. 3G shows successive masking and ion-implantation to form precursor P-type collector sinker 368 and precursor N-type isolation sinker 372.

Figure 3H:
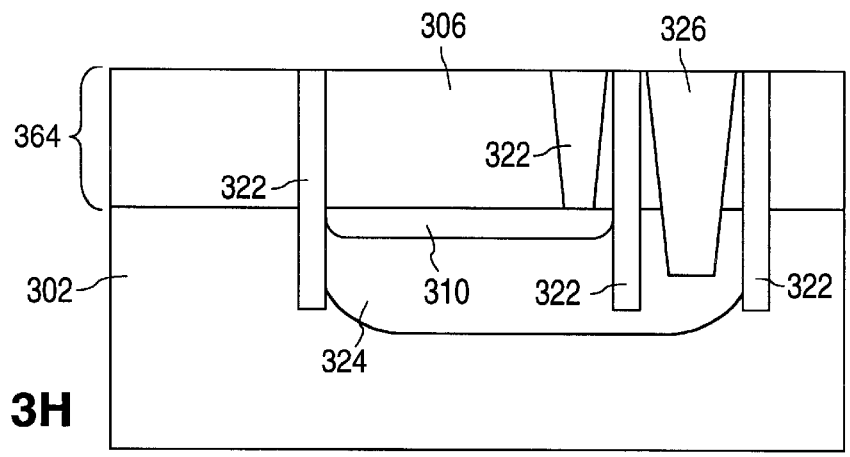

FIG. 3H shows exposure of the silicon substrate to a second thermal drive-in step, wherein heating causes thermal diffusion of conductivity-altering dopant, transforming the precursor P-type collector sinker region into P-type collector sinker 312 in contact with buried P-type layer 310. Heating also transforms precursor N-type isolation sinker into isolation sinker 326 in contact with isolation region 324.

Figure 3I:
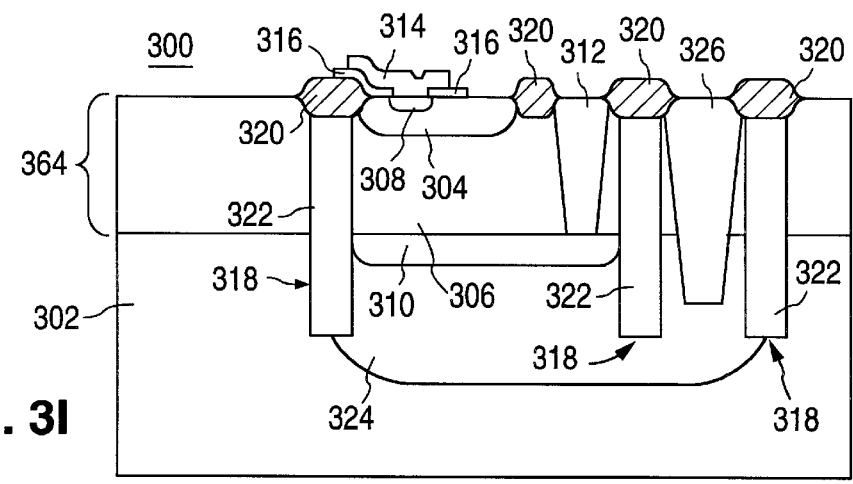

FIG. 3I shows completion of fabrication of PNP transistor 300 by conventional means, wherein field oxide 320 is grown, and N-type dopant is introduced into collector region 306 to form base 304. Emitter 308, polysilicon emitter contact 314, and intervening dielectric 316 are then created.

Figure 4:
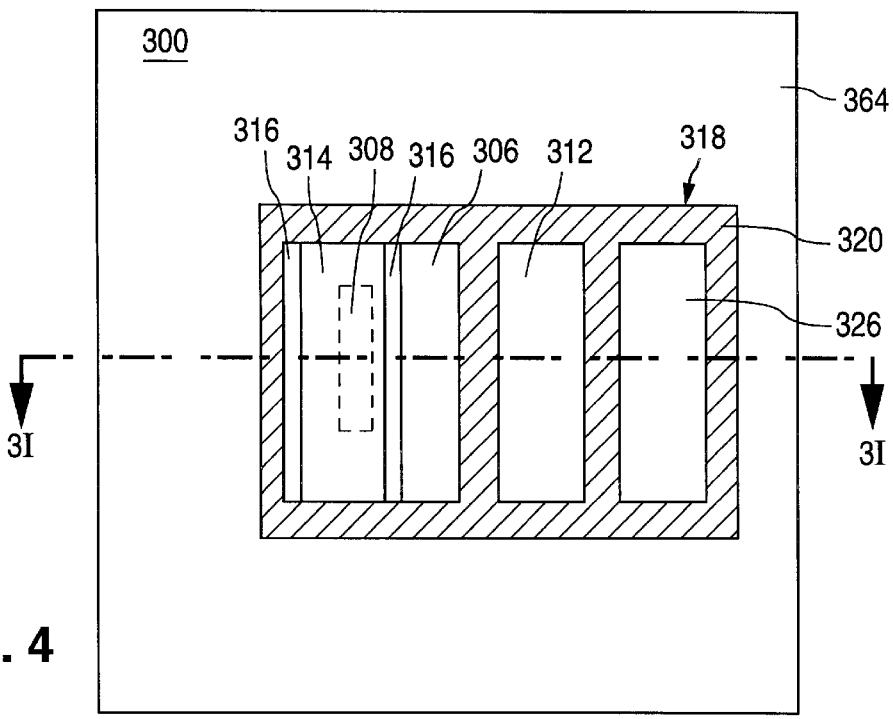
FIG. 4 shows a plan view of the vertically-isolated PNP bipolar transistor produced by the process shown in FIGS. 3A–3I.

FIG. 4 shows a plan view of the vertically-isolated PNP transistor device 300 formed by the process shown in FIGS. 3A–3I. Prior FIG. 3I is actually a cross-sectional view of transistor 300 of FIG. 4 taken along line 3I–3I'.

Figure 1A:
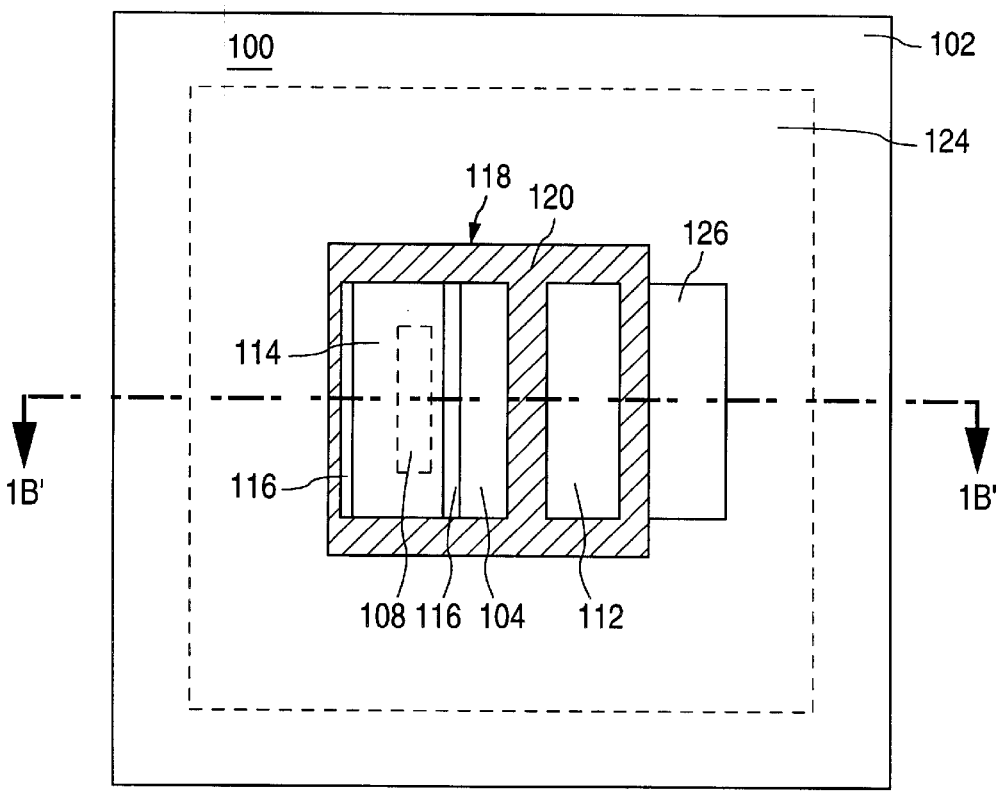
FIGS. 1A–1B show plan and cross-sectional views of a conventional vertically-isolated PNP transistor device.
Figure 1B:
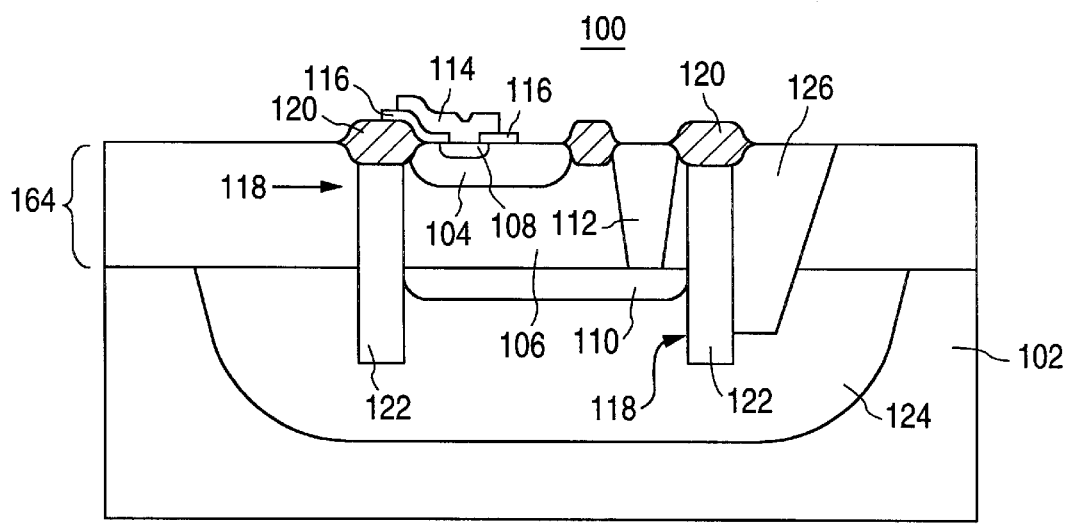
Figure 2A:
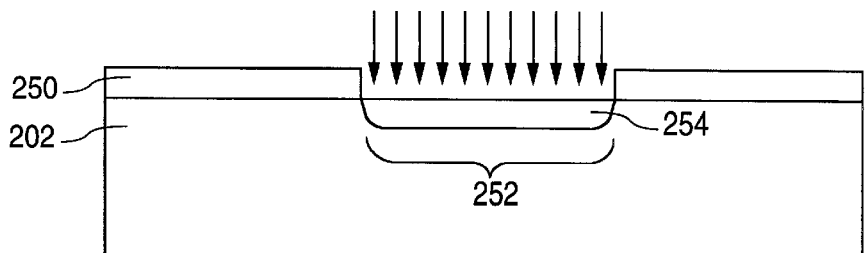
FIGS. 2A–2G show cross-sectional views of a conventional process flow for forming the PNP bipolar transistor of FIGS. 1A–1B.
Figure 2B:
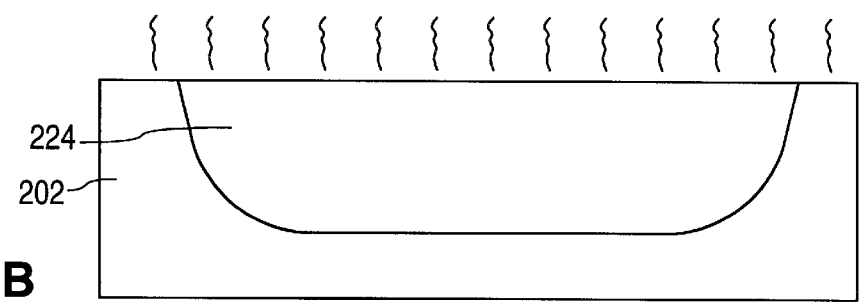
Figure 2C:
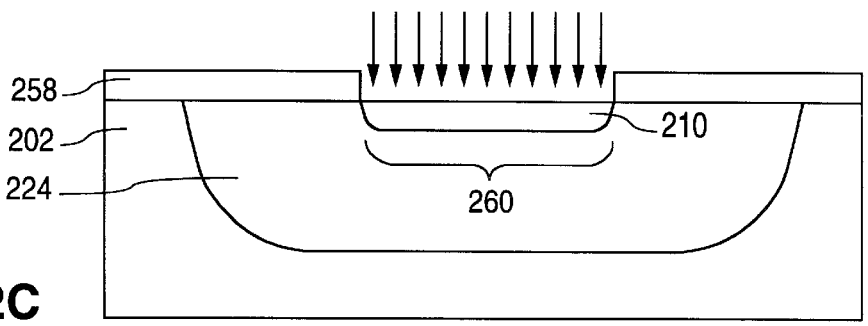
Figure 2D:
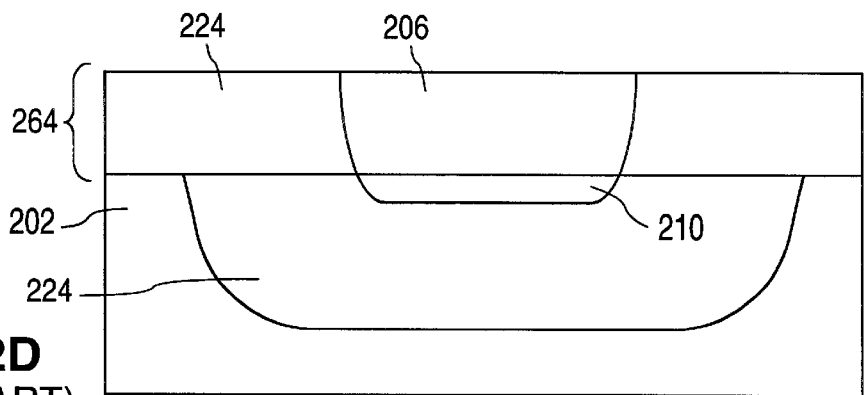
Figure 2E:
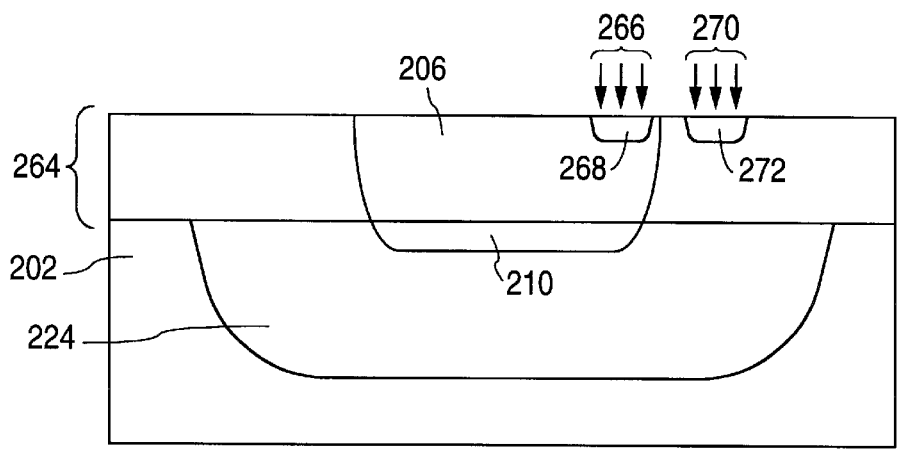
Figure 2F:
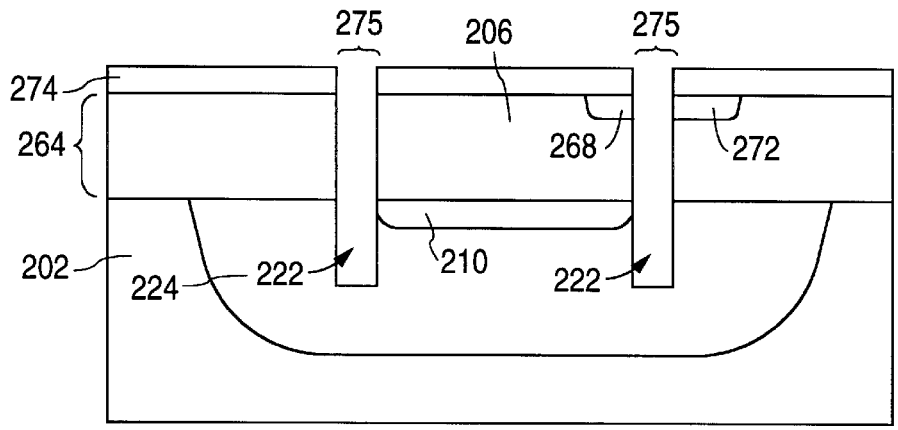
Figure 2G:
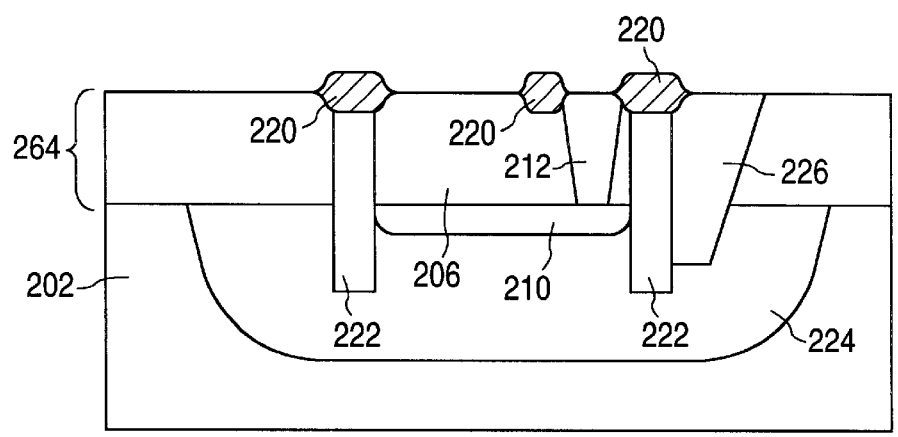

The process flow in accordance with the present invention offers a number of important advantages over the conventional process. Specifically, FIG. 4 shows that because lateral diffusion of N-type dopant of the isolation region is constrained by the first trench, bipolar transistor 300 occupies substantially less surface area than the conventional transistor shown in FIGS. 1A–1B.

Specifically, the length of transistor 300 is about 15 $\mu$m, and the width of transistor 300 is about 10 $\mu$m. Thus, the total area occupied by transistor 300 is about 150 $\mu m^2$, much smaller than the 1000 $\mu m^2$ area occupied by the conventional device of FIGS. 1A–1B. The savings in surface area is attributable to elimination of unnecessary peripheral portions of N-type isolation region 324.

Another advantage offered by the present invention is that the bipolar device exhibits substantially reduced parasitic capacitance. Specifically, because the lateral extent of the N-isolation region is reduced, the length of the P/N junction between the substrate and the N-isolation region is shortened. This reduces parasitic capacitance arising along this P/N junction.

Although the invention has been described in connection with one specific preferred embodiment, it must be understood that the invention as claimed should not be limited to this particular embodiment. Various other modifications and alterations in the structure and process will be apparent to those skilled in the art without departing from the scope of the present invention.

For example, while the process flow described in connection with FIGS. 3A–3I shows ion-implantation of N-type dopant to form the N-isolation region subsequent to etching and filling the circumscribing narrow deep trench with sacrificial material, this sequence is not required by the present invention. Implant of N-type isolation dopant could occur after formation and filling of narrow deep trenches and the process would remain within the scope of the present invention, so long as thermal drive-in of the implanted dopant occurs after etching and filling of the narrow deep trenches with sacrificial material.

Moreover, while the process shown above in FIGS. 3A–3I depicts ion-implantation of the precursor P- and N-type sinker regions prior to etching the narrow trench to form the wide trench, this is also not required by the present invention. A process flow in accordance with an alternative embodiment of the present invention could instead require formation and drive-in of the precursor sinker structures subsequent to formation and filling of the wide trench.

Furthermore, while the above FIGS. 3A–3I and 4 illustrate a process flow for forming a vertically-isolated PNP bipolar transistor, the present invention is not limited to fabrication of this structure. Specifically, a vertically isolated NPN bipolar transistor could also be formed in accordance with the present invention. In such an alternative embodiment, lateral thermal diffusion of P-type dopant necessary to isolate the collector from the underlying N-type substrate would be constrained by narrow trenches formed prior to thermal drive-in.

Finally, while the process flow depicted in FIGS. 3A–3I shows thermal drive-in of isolation dopant after filling the first narrow trench with sacrificial material, this is not required by the present invention. An unfilled first narrow trench will also serve to block the diffusion of dopant, and thus filling of the first narrow trench with sacrificial could also occur subsequent to thermal drive-in and the process flow would still fall within the scope of the present invention.

Given the above description and the variety of embodiments disclosed therein, it is intended that the following claims define the scope of the present invention, and that processes within the scope of these claims and their equivalents be covered hereby.

What is claimed is:

1. A process for forming a bipolar transistor comprising the steps of:

forming a first trench in a semiconductor workpiece of a first conductivity type, the first trench circumscribing a precursor device region;

filling the first trench with a sacrificial material;

introducing a conductivity-altering dopant of a second conductivity type opposite to the first conductivity type into the precursor device region;

causing the conductivity-altering dopant of the second type to diffuse in a vertical direction into the semiconductor workpiece, the first trench constraining lateral diffusion within the semiconductor workpiece of the conductivity-altering dopant of the second type;

forming a second trench in the semiconductor workpiece, the second trench broader than and encompassing the first trench, such that the sacrificial material is consumed;

filling the second trench with a dielectric material;

forming a collector of the first conductivity type within the precursor device region;

forming a base of the second conductivity type within the collector;

forming an emitter of the first conductivity type within the base.

2. The process according to claim 1, wherein:

the semiconductor workpiece comprises a single crystal silicon substrate;

the process further comprises the step of forming an epitaxial silicon layer of the first conductivity type over the single crystal silicon substrate following the step of causing vertical diffusion of the conductivity-altering dopant of the second type;

the step of forming the second trench includes forming a second trench through the epitaxial silicon and into the single crystal silicon; and the step of forming a collector comprises introducing a dopant of the first conductivity type into the single crystal silicon prior to epitaxial silicon formation, such that the collector is formed by upward diffusion of dopant of the first conductivity type during epitaxial silicon formation.

3. The process according to claim 1, wherein dopant of the first conductivity type is P-type dopant and dopant of the second conductivity type is N-type dopant.

4. The process according to claim 1 wherein dopant of the first conductivity type is N-type dopant and dopant of the second conductivity type is P-type dopant.

5. The process according to claim 1 wherein the step of filling the first trench with a sacrificial material comprises filling the first trench with silicon oxide.

6. The process according to claim 1 wherein the step of filling the second trench with a dielectric material comprises filling the second trench with undoped polysilicon.

7. The process according to claim 1 wherein:

the step of filling the first trench with a sacrificial material comprises filling the first trench with a sacrificial material impermeable to diffusion of the conductivity-altering dopant of the second type; and the step of filling the first trench precedes the step of causing the conductivity-altering dopant of the second type to diffuse in a vertical direction, such that the sacrificial material constrains lateral diffusion within the semiconductor workpiece of the conductivity-altering dopant of the second type.

8. The process according to claim 1 wherein the step of causing the conductivity-altering dopant of the second type to diffuse in a vertical direction precedes the step of filling the first trench with a sacrificial material, such that the unfilled first trench constrains lateral diffusion within the semiconductor workpiece of the conductivity-altering dopant of the second type.

9. A method of constraining lateral diffusion of a conductivity-altering dopant within a semiconductor workpiece during a thermal drive-in step, the method comprising the steps of:

circumscribing a precursor doped region of the semiconductor workpiece with a first trench;

introducing the conductivity-altering dopant into the precursor doped region; and applying a thermal energy to drive the dopant into the semiconductor workpiece after formation of the first trench, such that the first trench blocks lateral diffusion of the conductivity-altering dopant.

10. The method according to claim 9 wherein the semiconductor workpiece is a single crystal silicon substrate, and wherein the method further comprises the steps of:

filling the first trench with a sacrificial material prior to the step of applying thermal energy, the sacrificial material impermeable to diffusion of the conductivity-altering dopant;

forming epitaxial silicon over the single crystal silicon substrate after filling of the first trench with sacrificial material;

forming a second trench through the epitaxial silicon and the sacrificial material; and filling the second trench with a dielectric material.

11. The process according to claim 10 wherein the step of filling the first trench with a sacrificial material comprises filling the first trench with silicon oxide.

12. The process according to claim 10 wherein the step of filling the second trench with a dielectric material comprises filling the second trench with undoped polysilicon.

13. The method according to claim 9 wherein the step of applying the thermal energy forms a vertical isolation region underlying a collector of a bipolar transistor.

14. The method according to claim 9 wherein the step of introducing conductivity-altering dopant comprises introducing N-type dopant.

15. The method according to claim 9 wherein the step of introducing conductivity-altering dopant comprises introducing P-type dopant.

* * * * *